United States Patent [19]
Zoller

[11] Patent Number: 5,399,964
[45] Date of Patent: Mar. 21, 1995

[54] PEAK AMPLITUDE DETECTOR FOR USE IN A SYNCHRONIZED POSITION DEMODULATOR

[75] Inventor: Allan C. Zoller, Cleveland, Ohio

[73] Assignee: Elsag International N.V., Amsterdam Zuidoost, Netherlands

[21] Appl. No.: 110,020

[22] Filed: Aug. 23, 1993

[51] Int. Cl.6 .................. G01R 19/04; H03K 5/00
[52] U.S. Cl. .................. 324/103 P; 324/207.18; 324/102; 327/58; 327/94
[58] Field of Search ............... 324/207.18, 102, 103 P; 307/351, 352, 353; 318/656, 657; 340/870.36; 328/150, 151

[56] References Cited

U.S. PATENT DOCUMENTS

| | | | |
|---|---|---|---|
| 4,599,560 | 7/1986 | Sanford et al. | 324/207.18 |
| 4,627,080 | 12/1986 | Debus, Jr. | 328/151 |
| 4,777,629 | 10/1988 | Morris et al. | 307/351 |
| 4,847,548 | 7/1989 | Lafler | 324/207.18 |
| 4,857,919 | 8/1989 | Braswell | 324/207.18 |

OTHER PUBLICATIONS

Technical Bulletin AN59-14 pp. 1-8 by Schaevitz Engineering "Linear Variable Differential Transformer Demodulation Techniques"; 1959.

*Primary Examiner*—Sandra L. O'Shea
*Assistant Examiner*—R. Phillips
*Attorney, Agent, or Firm*—Michael M. Rickin; Paul R. Katterle

[57] ABSTRACT

A peak amplitude detector for use in a synchronized position demodulator associated with a linear variable differential transformer. The peak amplitude detector adjusts for phase shift in the transformer and maintains the full bandwidth of the transformer. The detector obtains the maximum positive or negative amplitude of the sinusoidal signal at one of the secondary windings of the transformer by first counting either a positive or negative half cycle of the signal and then while down counting one half of the counted half cycle sampling the amplitude of the sinusoidal signal. The sampling ends when the count reaches zero.

13 Claims, 1 Drawing Sheet

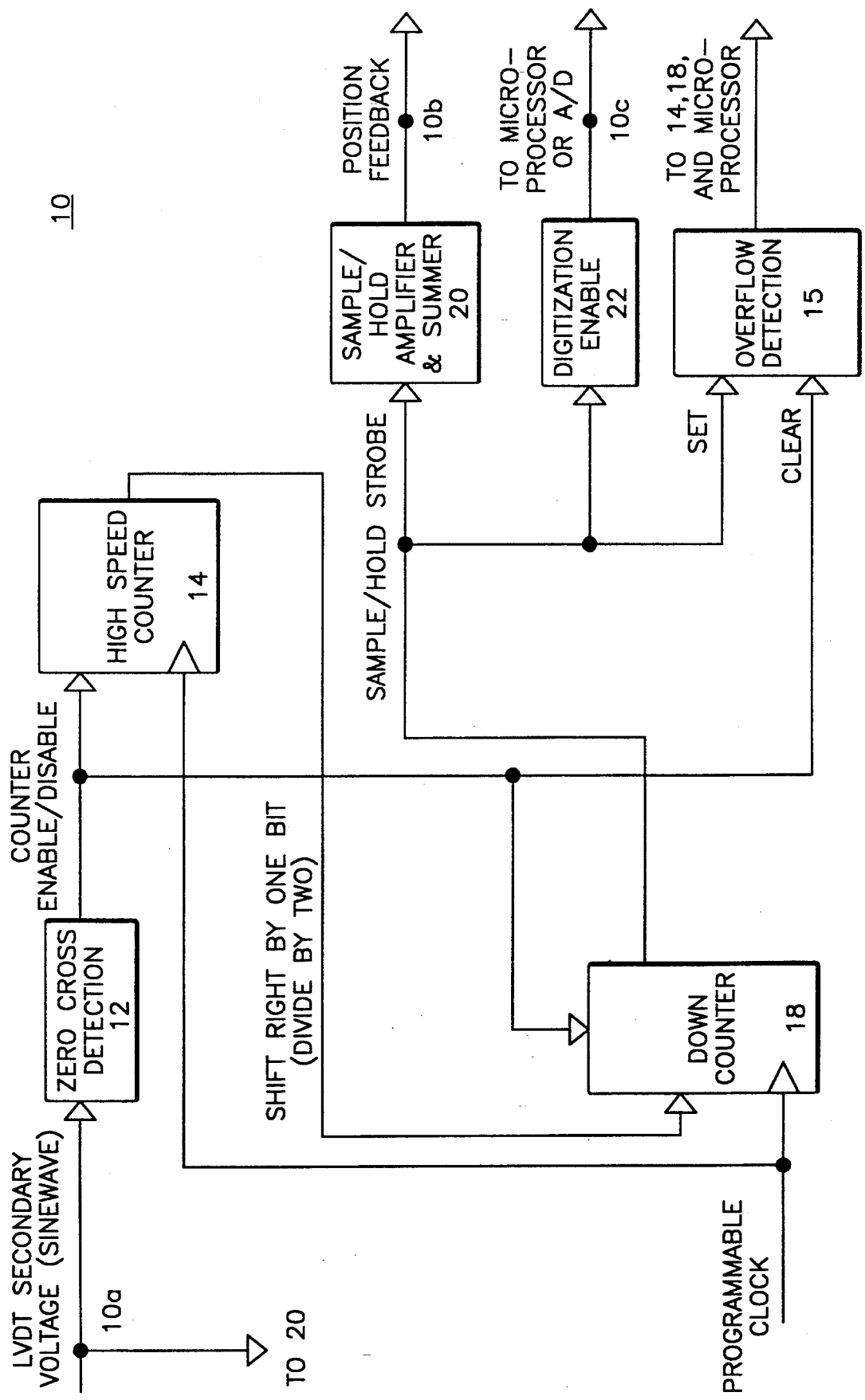

PEAK AMPLITUDE DETECTOR FOR USE IN A SYNCHRONIZED POSITION DEMODULATOR

FIELD OF THE INVENTION

This invention relates to a peak amplitude detector for use in the use of a linear variable differential transformer (LVDT) for position detection and more particularly to the demodulation of the secondary voltages of the LVDT.

DESCRIPTION OF THE PRIOR ART

A LVDT is used in a control system to provide a voltage which is representative of the position of a controlled device such as a valve. As is well known, the LVDT has a primary winding which receives a sinusoidal excitation voltage and two secondary windings. The LVDT also includes an iron core which is connected to the driver that provides the input to change the position of the controlled device. As the output of the driver changes to change the position of the controlled device the core moves relative to the primary and secondary windings of the LVDT to thereby change the amplitude of the AC voltage at the output of each secondary winding.

The output of each secondary winding of the LVDT is connected to a demodulator which provides at its output a DC signal representative of the position of the controlled device. This DC signal is used as the position feedback in a system for controlling the position of the controlled device.

One such demodulator well known to those skilled in the art uses a sample/hold amplifier which is strobed by a pulse synchronized to the primary of the LVDT to extract the peak or trough voltages of the AC signals at the LVDT secondary windings. However, this demodulator does not adjust for phase shift in the LVDT and as a result thereof can produce a lower signal-to-noise ratio and lead to other inaccuracies over time and with changes in temperature. Therefore, this demodulator can require frequent recalibration.

Another such well known demodulator rectifies and filters the sinusoidal signals at the outputs of the LVDT secondary windings thereby obtaining RMS values for those signals. While this known demodulator eliminates the phase shift problems described above, it causes a significant loss in bandwidth due to the extensive filtering required in the demodulator. Therefore, it is desirable to have a demodulator for use with a LVDT that both eliminates any phase shift problems and maintains the full LVDT bandwidth. The demodulator of the present invention meets these requirements.

SUMMARY OF THE INVENTION

A peak amplitude detector for a sinusoidal signal which includes a counter responsive to a clock signal for counting a half cycle of the sinusoidal signal starting when the sinusoidal signal crosses zero amplitude in one direction and ending when the sinusoidal signal crosses zero amplitude in the opposite direction. The counter holds a count representative of the half cycle when the counting ends.

The peak amplitude detector also includes another counter which is also responsive to the clock signal for counting one half of the count representative of the half cycle when the sinusoidal signal next crosses zero amplitude in the one direction. The peak amplitude detector further includes a sample and hold amplifier for sampling the amplitude of the sinusoidal signal starting when the another counter reaches a first predetermined count in its counting of one half of the half cycle representative count and ending when the another counter count reaches a second predetermined count whereby the amplifier holds the maximum amplitude of the sinusoidal signal when the sampling ends.

A method for detecting the peak amplitude of a sinusoidal signal which includes the step of counting in a counter in response to a clock signal generated externally to the counter a half cycle of the sinusoidal signal starting when the sinusoidal signal crosses zero amplitude in one direction and ending when the sinusoidal signal crosses zero amplitude in the opposite direction. When the counting ends the half cycle counting means holding a count representative of the half cycle.

The method also includes the step of counting in another counter in response to the externally generated clock signal one half of the half cycle representative count when the sinusoidal signal next crosses zero amplitude in the one direction. The method further includes the step of sampling using a sample and hold amplifier means the amplitude of the sinusoidal signal starting when the another means reaches a first predetermined count in its counting of one half of the half cycle representative count and ending when the another means count reaches a second predetermined count whereby the amplifier means holds the maximum amplitude of the sinusoidal signal when the sampling ends.

DESCRIPTION OF THE DRAWING

The only drawing shows a simplified block diagram of a demodulator circuit which includes the peak amplitude detector circuit of the present invention for use with one of the two secondary windings of a LVDT.

DESCRIPTION OF THE PREFERRED EMBODIMENT(S)

Referring now to the drawing figure, there is shown a simplified block diagram for a demodulator circuit 10 embodied in accordance with the present invention for use with the output of one of the two secondary windings of a LVDT (not shown). As will be described in more detail below, the circuit 10 shown in the drawing figure is used to detect the maximum positive amplitude, that is the peak, of the sinusoidal voltage at the output of the LVDT secondary winding to which it is connected.

Demodulator circuit 10 includes zero crossing detection circuit 12 which is used to detect the zero crossing of the LVDT secondary winding sinusoidal voltage that appears at input 10a of circuit 10. The output of circuit 12 is connected to the enable/disable input of a high speed upcounter 14, the clear input of an overflow detection circuit 16, and the enable/disable of a high speed down counter 18. The clock inputs of the counter 14 and counter 18 are connected to receive a clock signal having a programmable frequency.

Each time circuit 12 detects a positive going zero crossing the counter 14 is enabled. Each time circuit 12 detects a negative going zero crossing the counter 14 is disabled. Therefore, counter 14 counts the positive half cycles of the LVDT secondary winding AC voltage.

Shortly after circuit 12 detects a negative going zero crossing and prior to the next detection by circuit 12 of a positive going zero crossing, one half of the count in counter 14 is transferred to down counter 18 and counter 14 is reset to zero. Counter 18 is enabled when the next positive going zero crossing is detected by circuit 12. Therefore, counter 18 begins downcounting at the same time that counter 14 begins upcounting.

When the count in counter 18 reaches a predetermined count, a pulse is generated to a sample/hold amplifier 20. In response to the pulse the amplifier enters the sampling mode. When the count in counter 18 reaches zero the pulse to amplifier 20 is ended to thereby turn off the sampling mode and capture the amplitude of the sinusoidal voltage at that time. Therefore, the sampling mode of the amplifier 20 is synchronized to the sinusoidal voltage at the secondary winding of the LVDT.

Since the initial count in counter 18 is one half of the previous count in counter 14, the amplitude of the sinusoidal voltage captured by amplifier 20 should be the peak of the sinusoidal voltage. The amplifier 20 provides at output 10b of circuit 10 a DC signal that corresponds to the amplitude of the captured sinusoidal voltage.

It should be appreciated that while counter 18 was described above as counting down, an up counter could be used in its place. In that instance a predetermined count of the up counter would correspond to the maximum amplitude of the sinusoidal signal.

The control system of which circuit 10 is a part may also include a microprocessor (not shown) which is connected to receive the DC signal at output 10b by an analog to digital converter (not shown). Since some sample/hold amplifiers have a high sample offset that could decrease accuracy during the sampling mode, demodulator 10 also includes digitization enable circuit 22 in the form of a counter that provides a signal at output 10c of circuit 10 to enable and disable the analog to digital converter. The analog to digital converter is disabled during the sampling mode to thereby prevent digitizing of the signal at output 10b during the sampling mode.

The frequency of the clock signal is programmable to reflect the different ideal operating frequencies of individual LVDTs. This programmability of the clock frequency allows for maximum accuracy while minimizing the complexity of counters 14 and 18.

As described above, demodulator 10 also includes overflow detection circuit 16 which is set when the sampling mode in amplifier 20 is turned on and is cleared when counter 14 is disabled. A loss of the sinusoidal voltage at input 10a will prevent the clearing of circuit 16. The output of circuit 16 is connected through logic circuitry, not shown, to counters 14 and 18 in a manner well known to those skilled in the art to disable those counters if there is a loss of voltage at the secondary winding of the LVDT. Circuit 16 is also connected to the microprocessor to notify that device if there is a loss of LVDT secondary winding voltage. Therefore, circuit 16 ensures that any loss of voltage at the secondary winding of the LVDT will avoid giving rise to incorrect position feedback values.

It should be appreciated that a demodulator circuit identical to circuit 10 is connected to the output of the other secondary winding of the LVDT. It should also be appreciated that the other demodulator circuit is used to sense the maximum negative amplitude, that is the trough, of the sinusoidal output voltage of the LVDT.

It should further be appreciated that the other circuit 10 operates to detect the trough in a manner similar to that described above for detecting the peak except that zero crossing detector circuit 12 provides the enabling signal when it detects a negative going zero crossing and the disabling signal when it detects a positive going zero crossing. It should also further be appreciated that the DC amplitude at outputs 10b of circuit 10 and the other circuit 10 are summed for use as the feedback signal representative of the position of the controlled device and it is that summed DC signal which is provided to the microprocessor by the analog to digital converter connected to output 10b.

It is to be understood that the description of the preferred embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. A peak amplitude detector for a sinusoidal signal comprising:
   a) first means responsive to a clock signal for counting a half cycle of said sinusoidal signal starting when said sinusoidal signal crosses zero amplitude in one direction and ending when said sinusoidal signal crosses zero amplitude in the opposite direction, said first means holding a count representative of said half cycle when said counting ends;
   b) second means responsive to said clock signal for counting one half of said half cycle representative count when said sinusoidal signal next crosses zero amplitude in said one direction; and
   c) sample and hold amplifier means for sampling the amplitude of said sinusoidal signal starting when said second means reaches a first predetermined count in its counting of one half of said half cycle representative count and ending when said second means count reaches a second predetermined count whereby said amplifier means holds the maximum amplitude of said sinusoidal signal when said sampling ends.

2. The peak amplitude detector of claim 1 further comprising means for determining when said sinusoidal signal crosses zero amplitude in said one direction and in said opposite direction.

3. The peak amplitude detector of claim 2 further comprising means for providing a signal to disable said first means and said second means if said means for determining when said sinusoidal signal crosses zero amplitude does not determine that said sinusoidal signal crosses zero in said opposite direction.

4. The peak amplitude detector of claim 1 further comprising means for providing an output signal representative of the interval of time starting when said second means count reaches said first predetermined count and ending when said second means count reaches said second predetermined count.

5. The peak amplitude detector of claim 2 further comprising means for providing an output signal representative of the interval of time starting when said second means count reaches said first predetermined count and ending when said second means count reaches said second predetermined count.

6. The peak amplitude detector of claim 1 wherein said second predetermined count of said second counter is zero.

7. The peak amplitude detector of claim 4 wherein said second predetermined count of said second counter is zero.

8. The peak amplitude detector of claim 5 wherein said second predetermined count of said second counter is zero.

9. A method for detecting the peak amplitude of a sinusoidal signal comprising the steps of:
   a) counting in a first means in response to a clock signal generated external to said first means a half cycle of said sinusoidal signal starting when said sinusoidal signal crosses zero amplitude in one direction and ending when said sinusoidal signal crosses zero amplitude in the opposite direction, said first means holding a count representative of said half cycle when said counting ends;
   b) counting in a second means in response to said externally generated clock signal one half of said half cycle representative count when said sinusoidal signal next crosses zero amplitude in said one direction; and
   c) sampling using a sample and hold amplifier means the amplitude of said sinusoidal signal starting when said second means reaches a first predetermined count in its counting of one half of said half cycle representative count and ending when said second means count reaches a second predetermined count whereby said amplifier means holds said peak amplitude of said sinusoidal signal when said sampling ends.

10. The method of claim 9 further comprising the step of determining when said sinusoidal signal crosses zero amplitude in said one direction and in said opposite direction before said step of counting a half cycle of said sinusoidal signal.

11. The method of claim 10 further comprising the step of providing a signal to disable said first means and said second means if said means for determining when said sinusoidal signal crosses zero amplitude does not determine that said sinusoidal signal crosses zero in said opposite direction.

12. The method of claim 9 further comprising the step of providing an output signal representative of the interval of time starting when said second means count reaches said first predetermined count and ending when said second means count reaches said second predetermined count, 13. The method of claim 10 further comprising the step of providing an output signal representative of the interval of time starting when said second means count reaches said first predetermined count and ending when said second means count reaches said predetermined count.

* * * * *